(12) United States Patent
Bryant et al.

(10) Patent No.: US 10,651,854 B2
(45) Date of Patent: May 12, 2020

(54) ADAPTIVE TEMPERATURE COMPENSATION

(71) Applicant: u-blox AG, Thalwil (CH)

(72) Inventors: Roderick Bryant, Thalwil (CH); Eamonn Glennon, New South Wales (AU)

(73) Assignee: u-blox AG, Thalwil (CH)

( * ) Notice: Subject to any disclaimer, the term of this patent is extended or adjusted under 35 U.S.C. 154(b) by 542 days.

(21) Appl. No.: 15/473,112

(22) Filed: Mar. 29, 2017

(65) Prior Publication Data
US 2017/0288679 A1    Oct. 5, 2017

(30) Foreign Application Priority Data
Mar. 31, 2016   (EP) .................................... 16163419

(51) Int. Cl.
*H03L 1/02*     (2006.01)
*H03B 5/04*     (2006.01)
(Continued)

(52) U.S. Cl.
CPC ............ *H03L 1/026* (2013.01); *G01S 19/235* (2013.01); *H03B 5/04* (2013.01); *H03L 1/00* (2013.01)

(58) Field of Classification Search
CPC ........... G01S 19/235; H03B 5/04; H03L 1/00; H03L 1/02; H03L 1/021; H03L 1/022; H03L 1/023; H03L 1/025; H03L 1/026; H03L 1/027; H03L 1/028
USPC ........................................................ 331/176
See application file for complete search history.

(56) References Cited

U.S. PATENT DOCUMENTS

| 4,746,879 A | 5/1988 | Ma et al. |
| 4,922,212 A | 5/1990 | Roberts et al. |
| (Continued) | | |

FOREIGN PATENT DOCUMENTS

| EP | 2871494 A1 | 5/2015 |
| GB | 2360404 A | 9/2001 |

OTHER PUBLICATIONS

European Extended Search Report, European Application No. 16163419.1, dated Oct. 20, 2016, 5 pages.
(Continued)

*Primary Examiner* — Levi Gannon
(74) *Attorney, Agent, or Firm* — Finnegan, Henderson, Farabow, Garrett & Dunner LLP

(57) ABSTRACT

A method of compensating for the temperature related frequency drift of an oscillator. The method comprises using an external reference frequency signal to derive oscillator compensation data over a range of operating temperatures, storing the oscillator compensation data in a first table, and, for a given operating temperature, using the first table to obtain corresponding oscillator compensation data and applying that data to provide compensation for the temperature related frequency drift. The method further comprises defining, for the range of operating temperatures, a series of temperature slots each sub-divided into a series of temperature bins. The step of using an external reference frequency signal to derive oscillator compensation data over the range of operating temperatures comprises
 a) measuring an operating temperature and using the external reference frequency signal to determine oscillator compensation values for respective temperatures as the operating temperature varies;
 b) accumulating the determined oscillator compensation values in corresponding temperature bins of a second table;

(Continued)

c) at spaced intervals in time, using the data accumulated in the temperature bins of the second table to determine or update the oscillator compensation data stored for one or more slots in the first table.

18 Claims, 6 Drawing Sheets

(51) Int. Cl.
    *G01S 19/23*     (2010.01)
    *H03L 1/00*     (2006.01)

(56) References Cited

U.S. PATENT DOCUMENTS

| | | | | |
|---|---|---|---|---|
| 5,117,206 A | * | 5/1992 | Imamura | H03L 1/026 331/158 |
| 5,392,005 A | | 2/1995 | Bortolini et al. | |
| 5,519,388 A | * | 5/1996 | Adair, Jr. | G08B 29/22 340/870.02 |
| 5,892,408 A | * | 4/1999 | Binder | H03L 1/026 331/176 |
| 7,459,984 B2 | | 12/2008 | Wang et al. | |
| 2002/0158693 A1 | | 10/2002 | Soong et al. | |
| 2006/0267703 A1 | | 11/2006 | Wang et al. | |
| 2009/0278616 A1 | | 11/2009 | Nicholls et al. | |
| 2011/0163817 A1 | * | 7/2011 | Nakamura | H03H 9/02259 331/18 |

OTHER PUBLICATIONS

Penrod, B.M., "Adaptive Temperature Compensation of GPS Disciplined Quartz and Rubidium Oscillators," 1996 IEEE International Frequency Control Symposium, IEEE, Jun. 5, 1996, pp. 980-987.

* cited by examiner

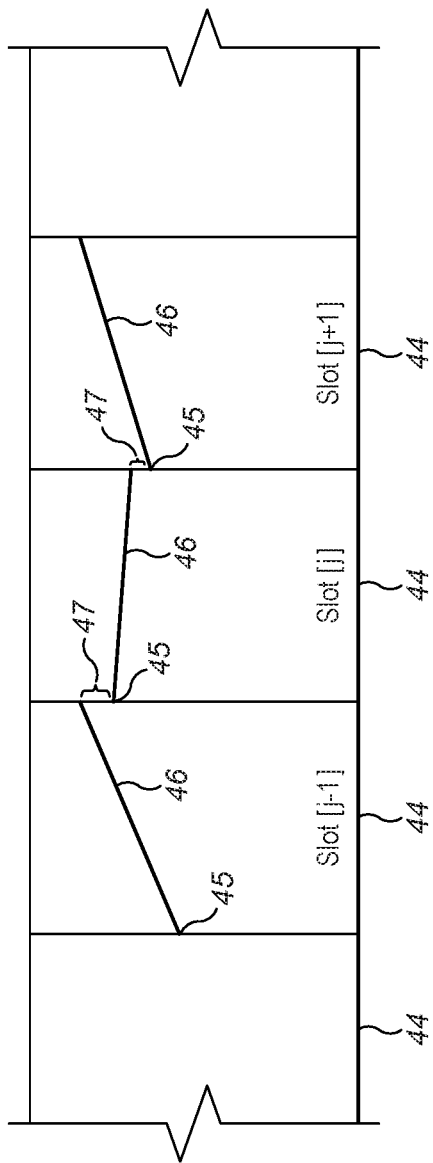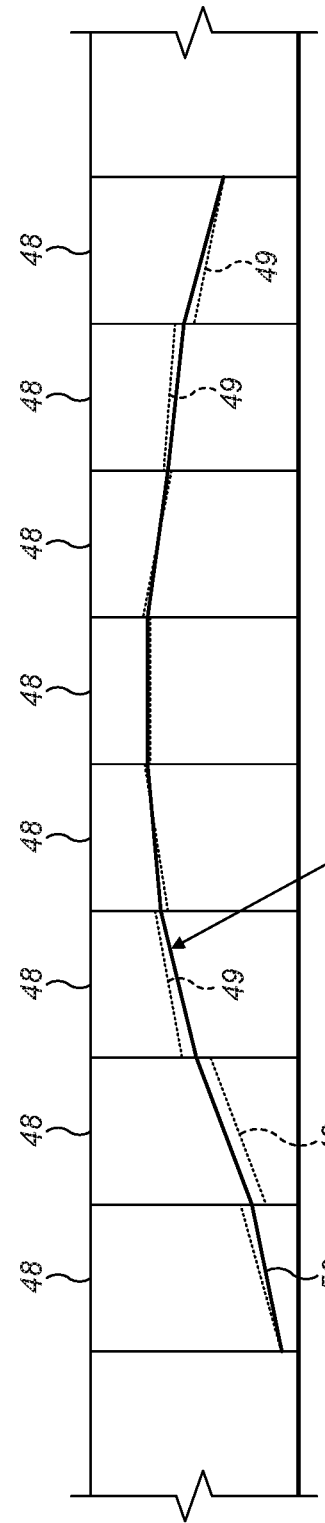

ADAPTIVE TEMPERATURE COMPENSATION

CROSS-REFERENCE TO RELATED APPLICATIONS

This application claims the right of priority based on EP application serial no. 16163419.1, filed Mar. 31, 2016, which is incorporated by reference in its entirety.

TECHNICAL FIELD

The present invention relates to compensating for the temperature related frequency drift of an oscillator.

BACKGROUND

Oscillators are used in a wide range of systems to provide a reliable reference frequency. Different oscillator designs provide different degrees of stability, typically with cost increasing with the level of stability. Many types of oscillators suffer from temperature dependence and from drift due to aging. This problem is particularly severe with crystal oscillators. In some oscillator designs, the oscillator may be disciplined by determining the frequency offset between the (internal) frequency generated by the oscillator and an external frequency reference. Some Global Navigation Satellite System (GNSS) receivers apply this approach, making use of one or more satellite signal carrier frequencies as the external frequency reference(s). A typical GNSS receiver makes continuous use of an oscillator for operational purposes. The oscillator output is used as a stable frequency reference for down-converting the GNSS signals and for generating the local code replica used to "despread" the spread spectrum baseband signals. Some Global Navigation Satellite System (GNSS) receivers make use of one or more satellite signal carrier frequencies as the external frequency reference(s) to measure and track the frequency offset and allow for this offset in their internal calculations, but do not discipline the oscillator. Other GNSS receivers discipline the oscillator i.e., they use the frequency offset to determine a control voltage and apply this to the crystal oscillator circuit to adjust for temperature and aging effects.

There may be occasions, however, when the external frequency reference is unavailable; the signals from the orbiting satellites may be blocked or suffer from temporary interference. If and when this happens, it is desirable that the receiver goes into 'holdover', during which time the receiver attempts to maintain a compensated oscillator frequency based on data collected during the preceding (normal) operating period. Various schemes for providing temperature compensation are known in the prior art.

U.S. Pat. No. 4,922,212 discloses an oscillator temperature-effect compensation scheme that relies upon a predetermined oscillator temperature-frequency transfer curve. An ambient temperature is measured by a temperature sensor and is used to evaluate the transfer curve and to determine a temperature compensation voltage. Aging effects are accounted for using an appropriate value. US2002/0158693 provides a mechanism for predicting the oscillation frequency in terms of physical parameters including temperature. This is then used during periods in which the reference signal is unavailable to adjust the oscillator control voltage.

The temperature characteristics of oscillators are often specific to the individual oscillators. The use of a predefined function is unlikely to be able to take account of individual oscillator behaviour. U.S. Pat. No. 4,746,879 describes an alternative approach which involves creating and storing, during initial device calibration, a look-up table mapping temperatures to compensation values. However, whilst such an approach can take account to some extent of individual device characteristics, it cannot compensate for device aging. U.S. Pat. No. 5,892,408 discloses a related approach.

A better approach involves the use of look-up tables that are dynamically maintained. US2006/0267703 exemplifies this approach. A look-up table is created by periodically measuring and recording ambient temperature and frequency offset/compensation value using the external frequency reference. When the external frequency reference is unavailable, the measured ambient temperature is measured and used to obtain a frequency offset or compensation value from the look-up table. This approach has the advantage that aging effects are inherently compensated for due to the dynamic updating of the look-up table.

U.S. Pat. No. 5,392,005 uses stored compensation values and addresses the aging issue for crystal oscillators by providing a mechanism whereby the temperature compensation factors are adjusted by use of the reference signal when the oscillator frequencies have drifted from the reference signal in excess of a specified tolerance.

The use of dynamically updated look-up tables mapping temperature to offset frequency or compensation value provides an effective mechanism to compensate local crystal oscillators or their outputs for the effects of temperature dependent variations and aging. However, the prior art approaches require the collection and storage of relatively large amounts of data in order to enable compensation over a sufficiently wide range of potential operating temperatures and with sufficient temperature resolution. Especially in the case of mobile receivers, memory requirements present a significant cost and "real estate" overhead.

SUMMARY

According to a first aspect of the present invention there is provided a method of compensating for the temperature related frequency drift of an oscillator. The method comprises using an external reference frequency signal to derive oscillator compensation data over a range of operating temperatures, storing the oscillator compensation data in a first table, and, for a given operating temperature, using the first table to obtain corresponding oscillator compensation data and applying that data to provide compensation for the temperature related frequency drift.

The method further comprises defining, for the range of operating temperatures, a series of temperature slots each sub-divided into a series of temperature bins. The step of using an external reference frequency signal to derive oscillator compensation data over the range of operating temperatures comprises a) measuring an operating temperature and using the external reference frequency signal to determine oscillator compensation values for respective temperatures as the operating temperature varies;
b) accumulating the determined oscillator compensation values in corresponding temperature bins of a second table;
c) at spaced intervals in time, using the data accumulated in the temperature bins of the second table to determine or update the oscillator compensation data stored for one or more slots in the first table.

At least certain embodiments of the invention provide a solution to the problem of limiting or reducing memory requirements. This is achieved by allowing dynamic data collection over only a relatively small region of the overall operating range.

The step of applying the oscillator compensation data to provide compensation for the temperature related frequency drift may comprise applying the oscillator compensation data to the oscillator in dependence upon a current temperature in order to discipline the oscillator and thereby obtain a temperature compensated oscillator frequency.

The step of applying the oscillator compensation data to provide compensation for the temperature related frequency drift may comprise applying the oscillator compensation data to a processing operation that uses as an input a frequency output by the oscillator, where the oscillator operates as a non-disciplined oscillator.

The method may further comprise retaining, in the second table, only data associated with:
  temperature bins within a current temperature slot, where the current temperature slot contains the current temperature; and
  temperature bins associated with one or more temperature slots which are sequential with said current temperature slot,
the total number of temperature slots for which data are retained being less than the total number of temperature slots. The or each sequential slot may be a slot adjacent to the current temperature slot.

In the method presented above, step b) may comprise, for each value, adding the value to a sum for the bin stored in the second table and incrementing a count for the bin.

The method may comprise maintaining a third, intermediate table, wherein step c) comprises, at said spaced intervals in time, using the data accumulated in the temperature bins of the second table to determine or update data stored for the corresponding slots in the third table and using the data in the third table to populate the first table. The step of using the data accumulated in the temperature bins of the second table to determine or update data stored for the corresponding slots in the third table may comprise, for each slot, determining or updating parameters of a linear fit to the data in the bins of the slot and storing the parameters in the third table. These parameters may be an oscillator compensation value for a given temperature of the slot and a rate of change value. The step of updating said parameters may comprise combining, for each slot, the currently stored parameters with respective newly determined parameters.

The method may further comprise storing in the third table, for each slot, a variance value of each parameter, said step of combining taking account of the associated variance value. The step of using the data in the third table to populate the first table may comprise adjusting the parameters of each slot in order to align the linear fits at slot boundaries.

The step of using the first table to obtain corresponding oscillator compensation data may comprise interpolating the data in the first table to obtain an oscillator compensation value for the current operating temperature.

Step c) may be carried out for a given temperature slot if it is determined that the total number of values accumulated for that slot exceeds a predefined threshold and that values are accumulated for at least a predefined fraction of the total number of bins in the slot. If both of the conditions are not met for a given slot, the largest of the bin sums may be identified and a determination made as to whether or not the largest sum exceeds a predefined threshold and, if yes, then all of the bin sums and count values for the slot are scaled back by a factor greater than 1 and, if no, then the bin sums and count values for the slot are left unchanged.

At a), the step of using the external reference frequency signal to determine oscillator compensation values may comprise one of:
  mixing the external reference frequency signal with an output of, or derived from, the oscillator to determine a frequency difference;
  counting cycles of the reference frequency signal during a period of a signal harmonically related to an output of, or derived from, the oscillator; or
  measuring a phase difference between the external reference frequency signal and an output of, or derived from, the oscillator at spaced intervals in time.

According to a second aspect of the present invention there is provided a method of operating a Global Navigation Satellite System, GNSS, receiver having an oscillator and a receiver for receiving at least one GNSS radio signal providing an external reference frequency signal, the method comprising using the method described above in order to discipline the oscillator.

According to a third aspect of the present invention there is provided apparatus comprising:
  an oscillator;
  a receiver configured to receive an external reference frequency signal;
  a physical memory;
  a temperature sensor; and
  a processing circuit configured to use the external reference frequency signal to derive oscillator compensation data over a range of operating temperatures, to store the oscillator compensation data in a first table within the physical memory and, for a given operating temperature, to use the first table to obtain corresponding oscillator compensation data and apply that data to provide compensation for the temperature related frequency drift.

The apparatus is configured such that that the processor defines, for the range of operating temperatures, a series of temperature slots each sub-divided into a series of temperature bins, and in that the processor is configured to use an external reference frequency signal to derive oscillator compensation data over the range of operating temperatures by
  a) measuring an operating temperature and using the external reference frequency signal to determine oscillator compensation values for respective temperatures as the operating temperature varies;
  b) accumulating the determined oscillator compensation values in corresponding temperature bins of a second table within the physical memory; and
  c) at spaced intervals in time, using the data accumulated in the temperature bins of the second table to determine or update the oscillator compensation data stored for one or more slots in the first table.

According to a fourth aspect of the present invention there is provided a Global Navigation Satellite System receiver comprising the apparatus of the third aspect of the present invention.

BRIEF DESCRIPTION OF THE DRAWINGS

FIG. 4 is a graphical representation of the contents of the coarse table of FIG. 3;

FIG. 5 is a graphical representation of a compensation table according to an embodiment;

DETAILED DESCRIPTION

A method and apparatus will now be described which can achieve temperature compensation for an oscillator, for example an oscillator used to provide a frequency reference within a GNSS receiver. The method and apparatus rely on a compensation look-up table which provides a mapping between temperatures and oscillator control values. According to certain embodiments, these oscillator control values correspond to (e.g. digitally) compensation voltages to be applied to the oscillator (circuit) in order to cancel the frequency offset from the frequency reference signal. Such a voltage is sometimes referred to as a "zero control voltage" and the (digital) control value may be referred to as a "zero control value".

Figure 1:
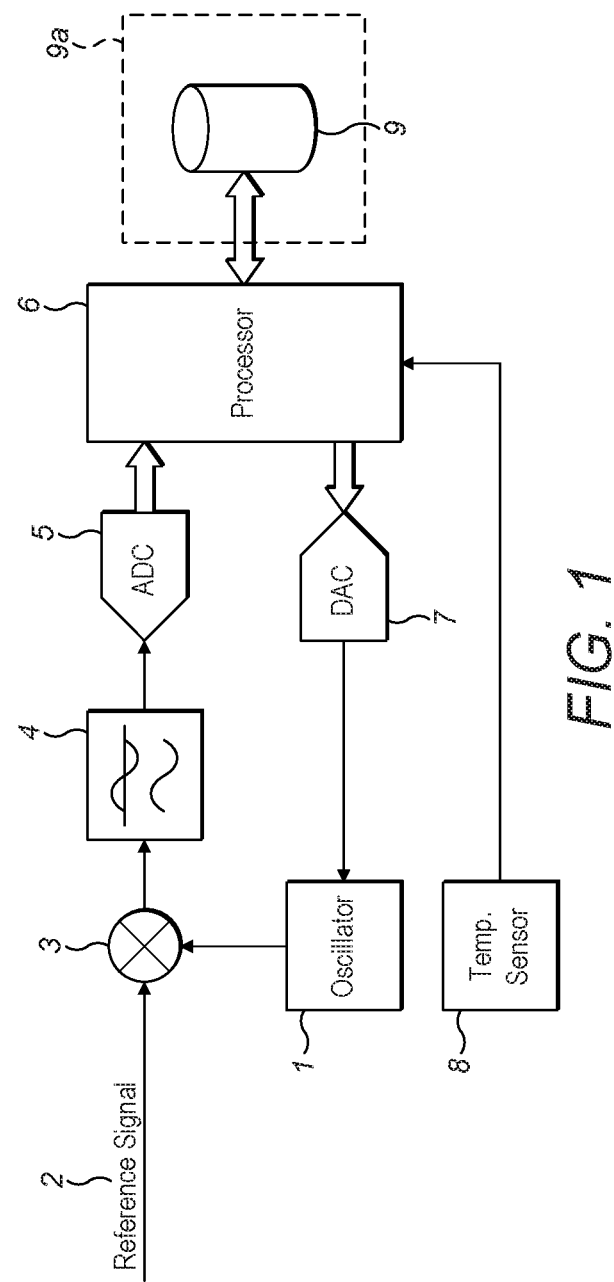
FIG. 1 illustrates schematically an apparatus for measuring the frequency difference between the output signal of an oscillator and a reference signal.

FIG. 1 is a schematic diagram of an apparatus for providing control of an oscillator 1 in order to minimise the frequency difference between the output of the oscillator 1 and the frequency ("reference frequency") of a received signal 2. The signal from the oscillator and the received signal 2 are fed into a mixer 3 and the result is filtered using a low-pass filter 4. The difference signal produced is digitised by an analogue-to-digital converter 5 and passed to a processor 6. Software running on the processor, e.g. implementing a Fast Fourier Transform (FFT), estimates the frequency offset between the reference frequency and the oscillator frequency. Based on this estimate, it determines a control value and passes this to a digital-to-analogue converter 7. The output of the digital-to-analogue converter is a zero control voltage (or some offset voltage). The apparatus operates at all times, including during normal operation when an external reference signal is available and during periods of holdover when the reference signal is unavailable, to supply a zero control voltage to the oscillator 1. During normal operation, the apparatus is essentially operating as a frequency locked loop, forcing the difference frequency (or the error) to zero so that the oscillator outputs a stable frequency essentially equal to that of the external reference.

A temperature sensor 8 is provided for recording the ambient temperature of the oscillator. Preferably the sensor 8 is located therefore close to the oscillator 1. At periodic intervals, when the apparatus is operating normally, i.e. when the reference frequency is available, the zero control value (i.e. the control value needed to produce the correct oscillator frequency) and the current temperature are recorded. This data is in turn used to update a compensation table 9 stored in a physical memory 9a. During periods of holdover, when the reference frequency is unavailable, the control value to be supplied to the digital-to-analogue converter 7 is obtained by using the current temperature as a look-up to the compensation table. The table returns an appropriate control value to the processor which in turn provides this to the digital-to-analogue converter 7. Thus, temperature compensation is achieved even when the reference frequency is unavailable. During holdover, the processor 6 may refresh the control value when the temperature change exceeds some predefined amount.

In other embodiments, the reference frequency may be compared to a synthesized frequency based on the oscillator frequency, where the synthesized frequency is a higher frequency signal phase-locked to the oscillator frequency. The synthesized signal will have a frequency that is either an integer multiple of the oscillator frequency or an integer ratio of the oscillator frequency. Note also that any form of digital-to-analog convertor (DAC) may be employed including a Pulse Width Modulator (PWM) with the filter rather than a monolithic DAC chip. Finally, the elements may be integrated at a silicon level into a single monolithic chip.

A GNSS receiver incorporates all of the elements needed for disciplining an oscillator. The GNSS signals themselves are precise frequency references with the complication that their frequencies are subject to Doppler shifts due to satellite and receiver motion. However, a GNSS receiver computes its own velocity and computes the satellite velocity based on the orbital equations. Hence, the receiver can, and routinely does, compute the expected signal Doppler offset very precisely.

Figure 2:
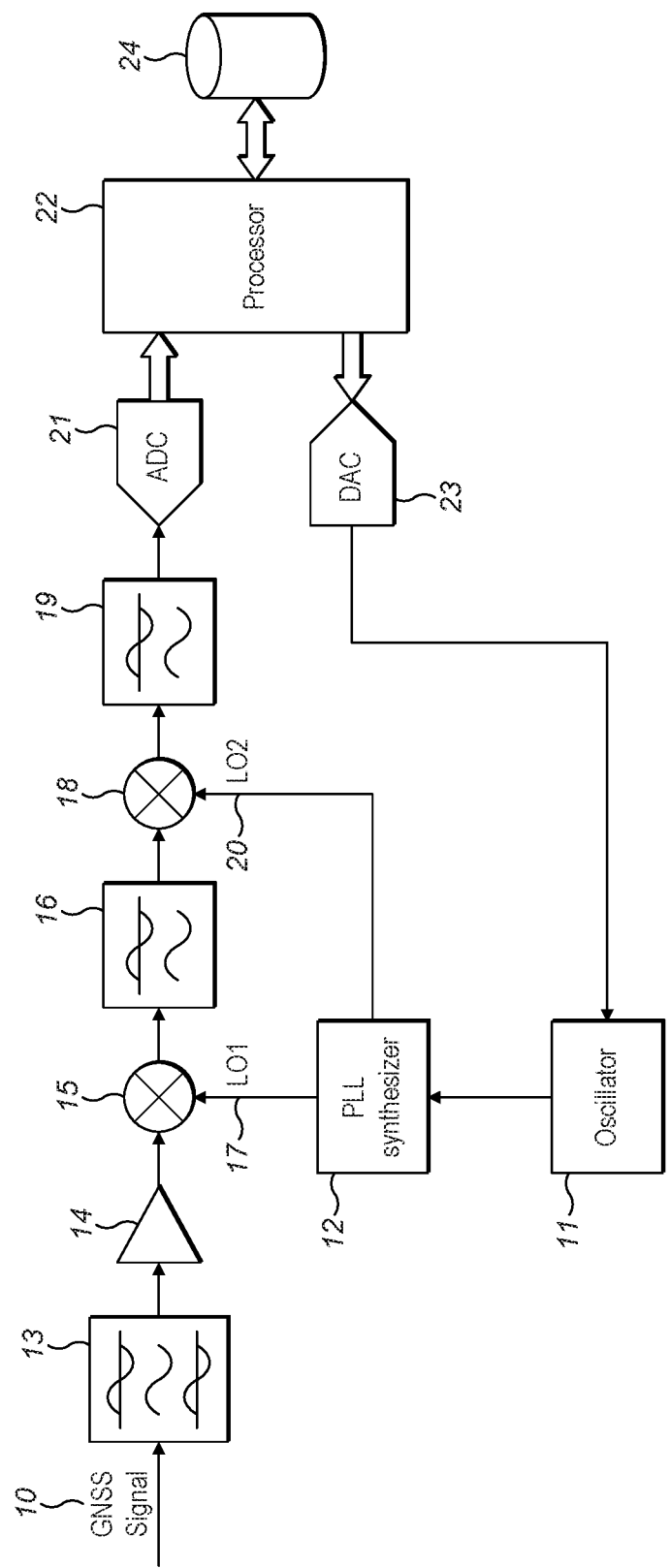
FIG. 2 illustrates schematically a GNSS receiver implementation.

FIG. 2 is a schematic diagram of an exemplary GNSS receiver with a superheterodyne architecture. The superheterodyne architecture of the GNSS front-end will typically have at least two local oscillator signals, however more are possible. In FIG. 2, two local oscillator signals LO1 and LO2 are illustrated, originating from the oscillator 11 and a phase locked synthesiser 12. The satellite signal 10 is received and passed through a first filter 13 and an amplifier 14. The result is then input into a first mixer 15 where it is mixed with a first local oscillator signal 17, and the result passed through a second filter 16, to produce a down-converted signal at an intermediate frequency. The process is repeated with a second mixer 18, receiving a second local oscillator signal 20, and third filter 19 in order to produce a down-converted low frequency signal. The final low frequency signal contains information that must be recovered in order to obtain position data. This is carried out by digitising the signal using an analogue-to-digital converter 21 and processing the digitised data using a processor 22. This processing may involve down-converting the low frequency signal to baseband, in the digital domain.

It will be appreciated that, within the processor 22, data can be made available to generate an oscillator control value. For example, conversion of the low frequency signal to baseband will result in a non-zero frequency signal when the oscillator frequency drifts. This signal is essentially the difference signal described above with reference to FIG. 1. The processor uses the difference signal to determine the required control value as described above, and passes this back to the oscillator via a digital-to-analogue converter 23. As before, a compensation table 24 is produced from the periodically measured temperature and the corresponding control values.

Whilst FIGS. 1 and 2 illustrate only the "final" compensation table, the data contained in this table is arrived at by way of a "fine" table and a "coarse" table. This procedure will now be described.

The operating temperature range of the apparatus is divided into a number of contiguous temperature slots of equal size, e.g. 2 degrees centigrade. Each slot in the fine table is further sub-divided into a number of contiguous temperature "bins", again, each of equal size. By way of example, each slot may be divided into sixteen bins. A physical memory in which the fine table data is stored (which may be a part of the physical memory 9a) is divided into bin locations, whilst the physical memory (again, possibly part of the physical memory 9a) in which the coarse table is stored is divided into slot locations. By way of example, temperatures may be mapped to slots and bins by way of a mapping between temperatures and memory addresses.

Figure 3:
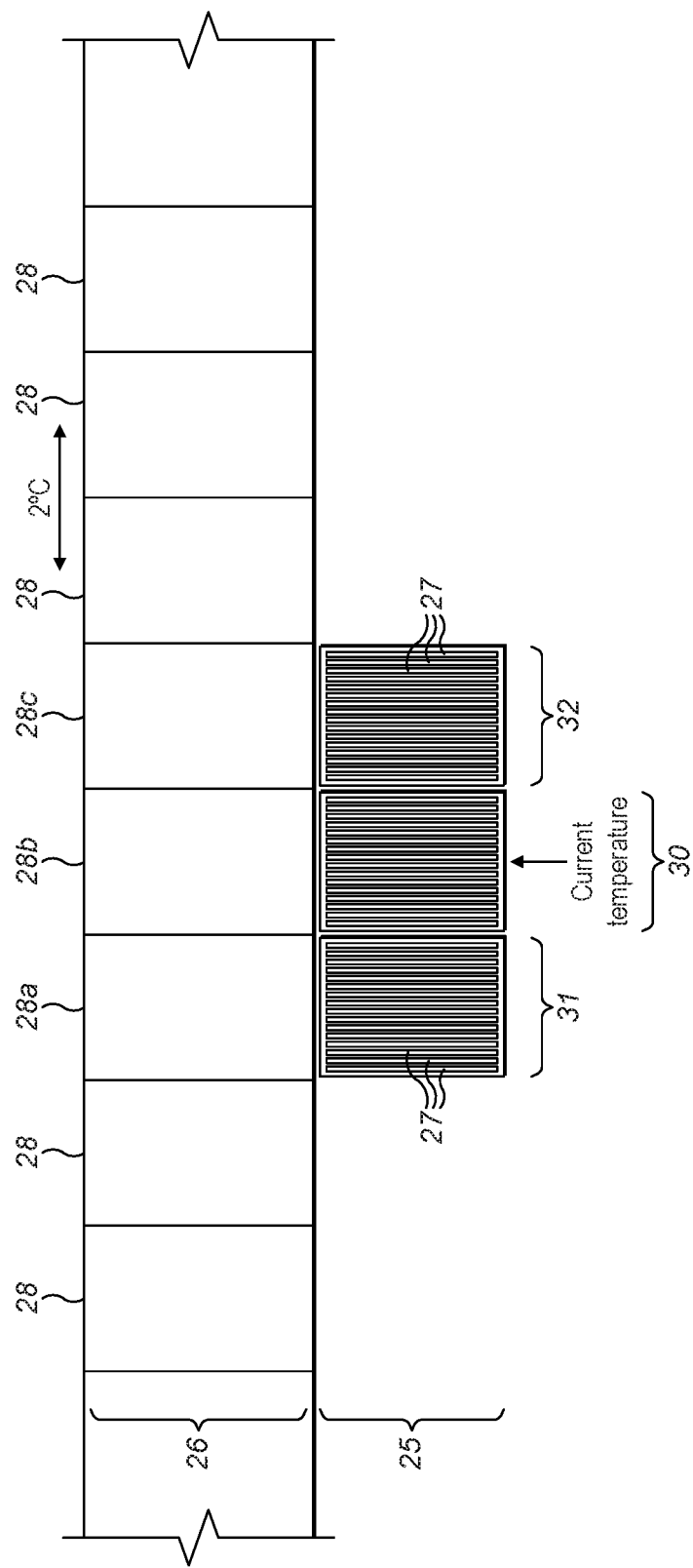
FIG. 3 illustrates schematically a relationship between a fine table and a coarse table according to an embodiment.

FIG. 3 illustrates the relationship between the fine table 25 and the coarse table 26 according to an embodiment. The fine table comprises a plurality of bins 27 and the coarse table a plurality of slots 28. Slot 28b corresponds to the current temperature. The fine table comprises sufficient bins to record measurements across three coarse table slots. As there are sixteen bins per slot, the fine table contains a total of forty eight bins. A central block 30 of sixteen bins of the fine table is associated with the slot 28b corresponding to the current temperature in the coarse table. Further blocks of bins 31, 32 in the fine table are associated with respective slots 28a, 28c on either side of the slot 28b for the current temperature.

During normal operation, temperature and calculated zero control value pairs are obtained periodically by the processor. At each collection point (in time), the control value is added to a sum (of determined control values) held in the bin of the fine table for temperature. A count maintained in the bin is also incremented such that the count indicates the number of control values incorporated into the sum. In order to avoid overflow of the sum for a bin, if the sum for that bin exceeds a threshold, then both the sum and the count are divided by an integer factor, for example four. This scaling does not affect the mean values obtained by dividing the sums by the counts (see below) since both are divided by the same factor. However, it effectively gives a higher weighting to new values that are summed into the bins. This has the advantage that, since aging may occur during the accumulation process, newer values may better reflect the current state of the oscillator.

The forty eight bins of the fine table together form a "sliding window" which moves in increments of sixteen bins, or one slot, in order to track the current temperature. Referring again to FIG. 3, if the current temperature moves into Slot 28a, the bins of the fine table 25 are reallocated one slot to the left. Similarly, if the current temperature moves in the opposite direction, i.e. Slot 28c, the bins of the fine table 25 are reallocated one slot to the right. Data contained within the bins for a slot no longer encompassed by the window is discarded or overwritten. This approach minimizes the amount of data stored in the bins as there is no need to maintain bins and associated data across the entire operating range. However, it maintains bins and data across a relatively small range of temperatures which are likely to cover the variation of temperature that might occur during a short holdover period, e.g. in this example, 2-3 degrees on either side of the current temperature. The approach also allows for a statistical analysis of the data as will be described further below. Of course, the person skilled in the art will appreciate that other arrangements for the fine bins are possible, such as maintaining bins for more than three slots or even maintaining bins for all of the slots. The invention is not limited to any one arrangement for the fine and coarse tables.

Data stored in the bins of the fine table is processed at discrete intervals in time, for example periodically, e.g. every 1 minute, in order to generate data with which to populate and update the coarse table 26. However, an initial step in this (periodic) processing operation may be to check, for each of the slots covered by the bins of the fine table, that sufficient data has been collected. One embodiment requires that the fine table records, for each slot, a grand sum value (referred to as M) for all of the bins in the slot. This value is the sum of all of the counts for the bins. The criterion for further processing and transferring the data is that the grand sum M exceeds a predefined threshold value. In an alternative embodiment, data for the bins of a given slot is only processed if a predefined portion of the bins are occupied, e.g. greater than 50%. In a further embodiment, both rules must be satisfied before the data for a given slot is processed, i.e. the grand sum M must exceed the predefined threshold value and the portion of occupied bins must exceed the predefined portion. The person skilled will appreciate of course that other rules may be applied to determine whether or not processing of data for a slot may proceed. In any event, if the rule(s) is(are) satisfied, processing of the data for the slot continues, otherwise data collection for the bins of that slot is resumed.

Assuming that the rule(s) is(are) satisfied, processing of the data for the slot proceeds as follows, with the aim of populating each of the slots of the coarse table corresponding to the currently "active" bins of the fine table, with a relationship between the control value and the temperature. In this example the relationship is a linear one, defined by a "y-intercept" (parameter A representing a control value at a given temperature) and a slope (parameter B). In this method, the "y-intercept" corresponds to the control value at the lower boundary of the temperature slot. The parameters A and B are determined in one embodiment using a least-squares regression method. In the following illustrative example, the lower boundary value and slope for a slot j are denoted as $A_j$ and $B_j$ respectively. One skilled in the art will appreciate that the parameter A need not represent a lower boundary value but could be any other known location within the slot.

In order to estimate the A and B parameters for a given slot j, the mean values for the control value (C) and temperature (T) are calculated. The mean $\overline{C}_j$ of the compensation values is calculated using:

$$\overline{C}_j = \frac{1}{M}\sum_{i=1}^{N}\left(\sum C\right)_i \quad (1)$$

where $(\Sigma C)_i$ is the sum of control values in the $i^{th}$ occupied bin and N is the total number of bins in the slot j. The mean temperature in a slot $\overline{T}_j$ is calculated using:

$$\overline{T}_j = \frac{1}{M}\sum_{i=1}^{N}(K_i T_i) \quad (2)$$

where $K_i$ is the count in the $i^{th}$ occupied bin and $T_i$ is the temperature corresponding to the $i^{th}$ occupied bin.

Next, the variance for the temperature is calculated using the formula for the variance of a sample:

$$S_T^2 = \frac{1}{M-1}\sum_{i=1}^{N}(K_i(T_i - \overline{T}))^2 \quad (3)$$

[NB. Instead of the term M−1 in the denominator of equation (3) the term M may be used.]

The slope is then estimated using the standard least squares regression formula:

$$B_j = \frac{M \sum_{i=1}^{N} K_i T_i \left(\sum C\right)_i - \left(\sum_{i=1}^{N} K_i T_i\right)\left(\sum_{i=1}^{N} \left(\sum C\right)_i\right)}{M(M-1)S_T^2} \quad (4)$$

The lower boundary value A for the slot is then estimated using the standard formula and the estimated value of the slope:

$$A_j = \overline{C}_j - B_j \overline{T}_j \quad (5)$$

In an embodiment, variances of A and B for a given slot j are determined using the assumption that the variances of $C_i$ are constant and equal to unity. The variances of A and B are hence determined by equations 6 and 7 respectively.

$$\sigma_A^2 = \frac{\sum_{i=1}^{N} K_i T_i^2}{M \sum_{i=1}^{N} K_i T_i^2 - \left(\sum_{i=1}^{N} K_i T_i\right)^2} \quad (6)$$

$$\sigma_B^2 = \frac{M}{M \sum_{i=1}^{N} K_i T_i^2 - \left(\sum_{i=1}^{N} K_i T_i\right)^2} \quad (7)$$

In an alternative embodiment, estimates are made of the individual variances of $C_i$. In another embodiment, arbitrary scaling factors are used for the variances. [Since the variances are only used during updates to weight the newly calculated values against the values of A and B stored in the table, it is only necessary that the scaling be consistent and not that the scaling gives them physical meaning.]

Once the processing is complete, the slope $B_j$ and lower boundary value $A_j$ values are entered into the slot j of the coarse table. If the entries for a particular slot are empty, the newly calculated values are simply inserted for the slot. If the slot already contains data, then the existing data is updated by applying a weighting to the old and the new values to generate updated values. In an embodiment, the weighting is applied as follows:

$$A_j = A_{jOld} + \text{Gain}(A_{jNew} - A_{jOld}) \quad (8)$$

Where $A_j$ is the updated value of the control value for slot j, $A_{jOld}$ is the value of the control value for slot j prior to the update, and $A_{jNew}$ is the new value estimated for the compensation value for slot j.

In an embodiment, the gain is determined as follows:

$$\text{Gain} = \frac{\sigma_{AjOld}^2}{(\sigma_{AjNew}^2 + \sigma_{AjOld}^2)} \quad (9)$$

Where $\sigma_{AjOld}^2$ is the variance associated with the value of the zero control value for slot j prior to the update and $\sigma_{AjNew}^2$ is the variance associated with the value estimated for the control value for slot j.

In an embodiment, an analogous method may be used to of update values for parameter B.

The value calculated for the gain in equation (9) depends on the relative variances of the old and new values of A. A relatively low variance for the current measurements, and hence a relatively high accuracy of the new value, means that a greater weight is assigned to the new value. Likewise, if the variance of the old value is low, then a greater weight is given to this value.

The person skilled in the art will appreciate that there are other ways to provide a value for the gain. For example, a fixed gain value may be used or a gain may be used that is related to the time elapsed since the previous update. In the latter case, if a long time has elapsed between updates for any particular slot in the coarse table then it is desirable that the gain of equation (9) should reflect this. In an embodiment, this can be achieved if the variance of the control value is updated to reflect the potential shift in the compensation value due to aging since the last update.

In an embodiment, prior to an update for a slot, the variance of the control value in the coarse table is adjusted to allow for an increase in variance due to aging since the last update. This would normally only be done if the elapsed time since the slot was last updated exceeds a threshold. This threshold and the formula for updating the variance in the slot would depend on the aging characteristics of the type of oscillator employed. No such adjustment would be made for the variance of the rate of change parameter, $B_j$, because aging primarily causes a vertical shift in the control value characteristic.

Following an update, the coarse table contains, for each slot, the parameters A and B and the respective variances. FIG. 4 illustrates graphically the parameters A and B of the coarse table. It illustrates several slots 44 of the coarse table 26 shown in FIG. 3 and the parameter A 45 and the parameter B 46 calculated for the slots. The coarse table is not used directly for compensating the oscillator (although that may be the case in alternative embodiments). Rather, each time it is updated, and also when it is restored from non-volatile memory on power-up, it is used to populate the compensation table discussed above. The compensation table is in the same form as the coarse table except that it does not include the variances.

In order to overcome the problem of the discontinuities apparent for example from FIG. 4, a smoothing or filtering process is applied to the coarse table data. In an embodiment, the process of smoothing the table comprises adjusting the values to take account of those in adjacent slots and this filtering process improves the accuracy of the table. In an embodiment, this is performed by taking the weighted average of the values of the A and B parameters for a plurality of slots. In an embodiment, the following is applied to adjust the parameter A:

$$\hat{A}_j = \frac{1}{4}\left(A_{j-1} + 2A_j + A_{j+1} + \frac{\Delta T}{2}(B_{j-1} - B_{j+1})\right) \quad (10)$$

In an embodiment, the parameter B is smoothed as follows:

$$\hat{B}_j = \frac{1}{4}\left(\frac{A_{j+1} - A_{j-1}}{\Delta T/2} + (-B_{j-1} + 2B_j - B_{j+1})\right) \quad (11)$$

The person skilled in the art will appreciate that other smoothing techniques can be used. For example, parameter A may be smoothed as follows:

$$\hat{A}_j = \frac{1}{4}(A_{j-1} + 2A_j + A_{j+1} + \Delta T(B_{j+1} - B_{j+1})) \quad (12)$$

Alternatively, the weighted average may be performed over more slots, for example five slots, taking into account two slots on each side of the current temperature slot. The invention is not limited to any one method of smoothing of the data.

FIG. 5 is a graphical representation of an example of the results of the smoothing process according to an embodiment. For each slot 48, both the unsmoothed lines 49 and the smoothed lines 50 are shown. In an embodiment, prior to the population of all slots in the compensation table, empty slots may be populated by interpolating the data of adjacent slots. It will be appreciated that the population of the compensation table with accurate rate of change estimates facilitates much more precise interpolation and extrapolation than would otherwise be possible using a relatively coarse look-up table.

Figure 6:
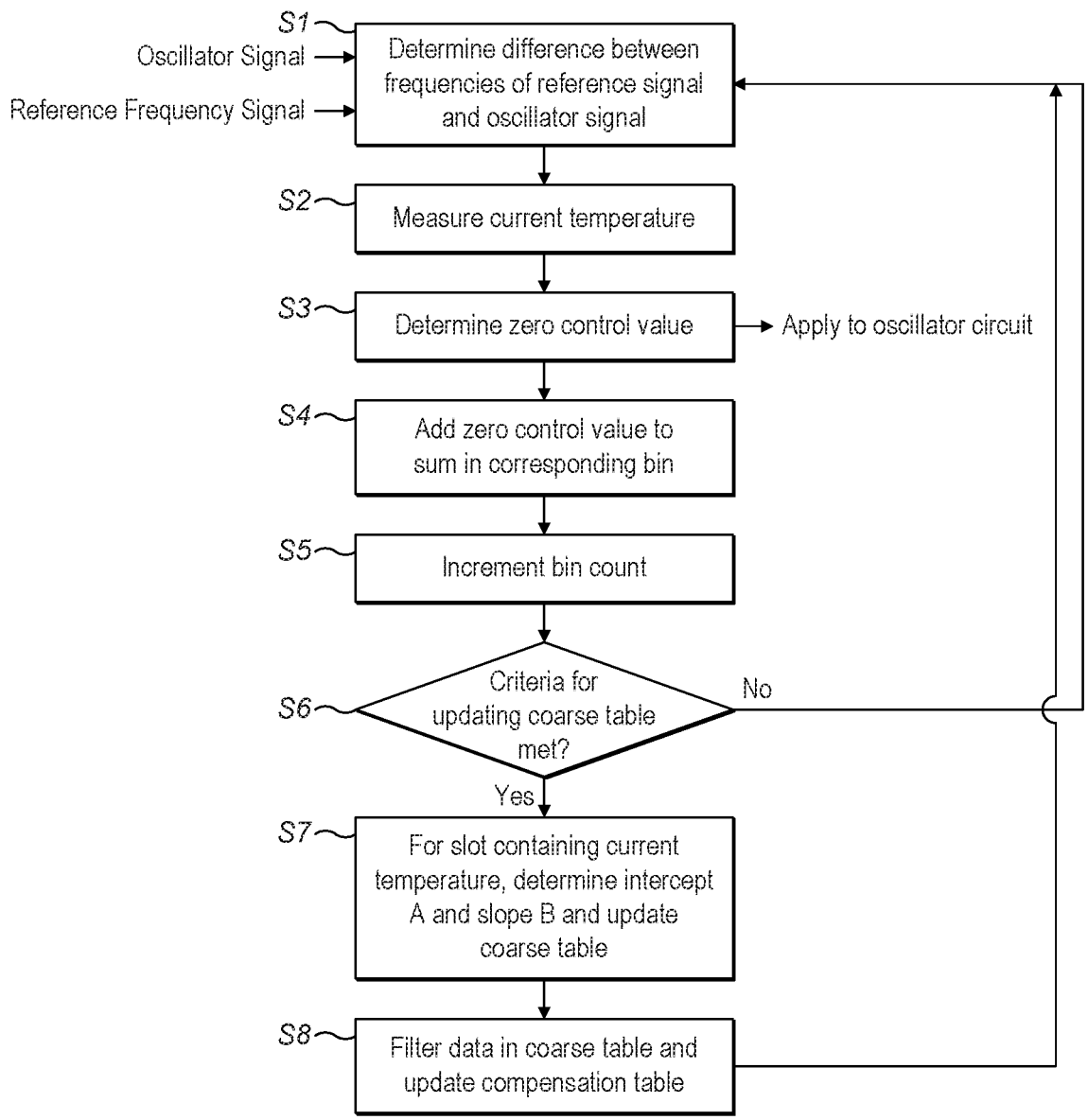
FIG. 6 is a flow chart giving an overview of a method according to an embodiment.

FIG. 6 is a flow chart giving an overview of a method of constructing a compensation table according to an embodiment. At step S1, a difference or offset between the frequency of the reference signal and the frequency of the oscillator signal is obtained. At step S2, the current ambient temperature of the oscillator is measured. Using a control loop this allows S3 a zero control value to be determined (the determined value is applied to the oscillator circuit in order to drive its frequency towards that of the reference signal). Then, at step S4, the bin of the fine table, corresponding to the current temperature of the oscillator, is updated. This involves adding the determined zero control value to the sum (of the bin). The count for the bin is also incremented at step S5.

At step S6 it is determined whether or not the criteria for updating the corresponding slot (associated with the updated bin) are met. If the criteria are not met, further measurements of the frequency difference along with temperature are gathered in accordance with steps S1 and S2. On the other hand if the criteria are met, then at step S7 intercept A and slope B for the slot are determined (taking into account respective variances) and the slot data for the coarse table is updated. At step S8 the slot data updated in the coarse table is smoothed to provide an update for the slot data of the compensation table. The process returns to step S1.

As already noted, during normal periods of operation, i.e. when the reference frequency is available, a closed-loop process is applied (FIG. 1) to minimize the difference between the oscillator frequency and the reference frequency. However, when the receiver goes into holdover, a zero control value must be determined, based on the current measured temperature, using the compensation (lookup) table. This involves firstly determining the mean of the actual (applied) zero control value for a time interval just prior to commencement of holdover. A zero control value is interpolated from the data in the compensation table, using the mean of the temperature for that prior time interval. For this purpose, recent measured temperature and determined zero control values are maintained in a memory. The difference between these two zero control values is determined. Thereafter, during holdover, the zero control value to be applied is estimated by adding this difference (as a correction) to the zero control value obtained by interpolation of the data in the compensation table using the current temperature. The value is refreshed, during holdover, as the temperature changes.

It is known that aging primarily impacts on the frequency versus temperature characteristic by way of a frequency offset across the complete frequency range. Assuming linearity of the control characteristic over small changes, this implies that aging causes an offset in the control value. Hence the correction described above is an estimate of the offset needed to correct the model (held in the compensation table) for aging since the coarse table was constructed.

On power-up, when no data is available for the immediately preceding time period, the receiver may use the compensation table to determine the control value by simply interpolating the table. The resultant control value does not allow for oscillator aging (since the compensation table was created) but is the best estimate available.

Figure 7:
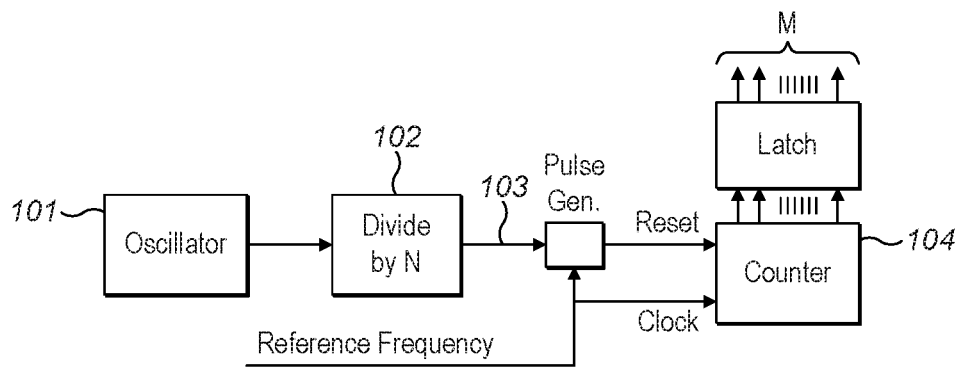
FIG. 7 illustrates schematically an alternative system for determining an offset between the frequency of a reference frequency signal and that of a signal generated by an oscillator.

In the embodiments described above, see for example FIGS. 1 and 2, a frequency difference (offset) is derived by mixing an output of the oscillator, directly or indirectly, with the reference signal. However, other approaches to obtaining the frequency difference may of course be utilized. FIG. 7 illustrates an approach that performs a frequency comparison in the digital domain. This involves counting cycles of the reference frequency within one period of a signal harmonically related to the frequency to be compared.

In the Figure it is desired to estimate the frequency of the signal generated by the oscillator 101 with respect to the Reference Frequency signal. The clock signal from the oscillator with frequency f, is applied to a digital divider 102 resulting in an output frequency 103 of f/N. This results in counter 104 counting reference frequency cycles for almost the whole cycle of the output signal from the divider, resulting in a count of M. From this, the relationship between the reference frequency and the oscillator frequency can be estimated as:

$$f = \frac{Nf_R}{M}.$$

One such estimate can be made every N/f seconds where f is in Hz and the resolution of the estimate is:

$$PPM = \frac{10^6 f}{Nf_R}.$$

Hence N can be increased to improve the resolution at the expense of the update rate or vice versa.

Another approach, described in EP2871494, is to measure the phase difference, θ, between the oscillator signal and the reference signal at two times with an interval of T seconds between the two measurements. There are various ways of measuring the phase difference using digital or analogue circuitry. Provided the difference in the frequencies is less than 1/T Hz, the oscillator frequency in Hz can be estimated as f=

$$f_R + \frac{\theta_2 - \theta_1}{2\pi T}.$$

If the frequency difference is more than 1/T Hz but less than 2/T Hz, then the frequency can be estimated as $$f = f_R + \frac{1}{T} + \frac{\theta_2 - \theta_1}{2\pi T}$$

or $$f_R - \frac{1}{T} + \frac{\theta_2 - \theta_1}{2\pi T}$$

and so on. Again, the resolution depends on T and the precision of the phase estimate but the approach can yield more precise measurements for the same period, T, than the divider-counter approach described above in connection with FIG. 7.

Figure 8:
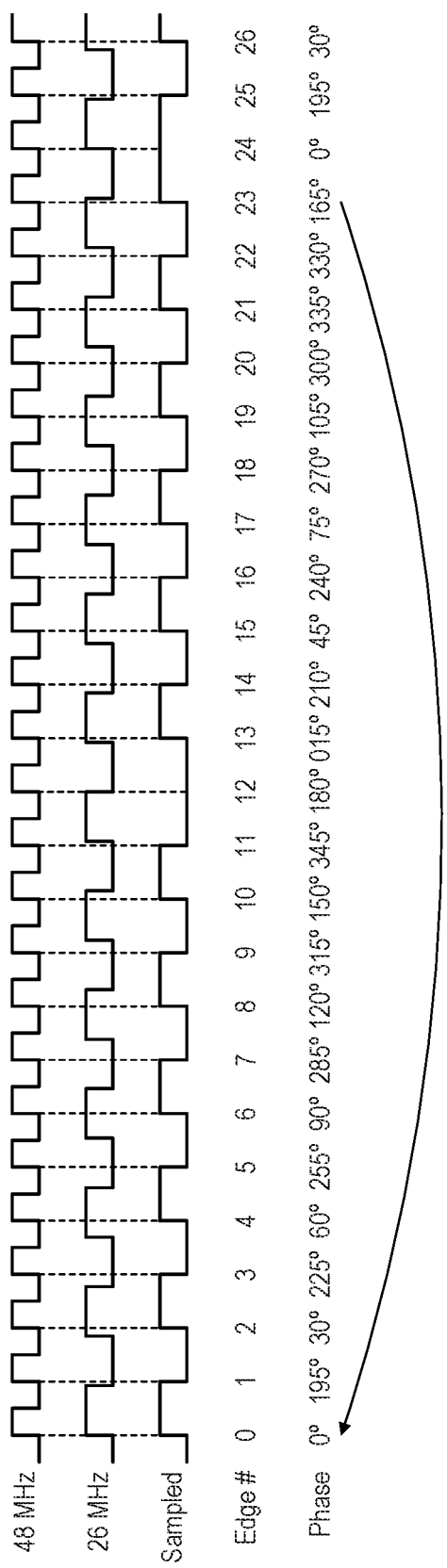
FIG. 8 illustrates schematically a further alternative scheme for determining an offset between the frequency of a reference frequency signal and that of a signal generated by an oscillator.

FIG. 8 illustrates this approach, sampling the signal from an external 26 MHz oscillator at a general-purpose input/output pin (GPIO) of a processor on each cycle of an internal 48 MHz clock. Similar schemes can be devised for almost any two frequencies. In the illustrated example, the Figure shows the progression of phase between a 48 MHz internal sampling clock and 26 MHz external clock. This is a pattern that repeats every 24 clock cycles. Regardless of the phase at a particular point in time, the phase, twenty four clock cycles later, will be the same.

The 'Sampled' line represents what would be measured by reading the GPIO pin on any particular sampling clock cycle. The GPIO pin is fed with the 26 MHz clock. Because the pattern repeats every 24 clock cycles, it is possible to measure a sample at any particular step x by reading the pin at 'x+(24*n)' clock cycles later, for any integer value of n.

The smallest phase step possible from sample 0 is either sample 13 (+15 degrees) or sample 11 (−15 degrees). If one were to make a measurement every 13 clock cycles, then each measurement will shift by 15 degrees forwards in phase from the previous measurement. The resulting sample would be:    111111111110000000000001111111111110000000000-000111111111111 . . . .

After each 12 samples, a transition on the output will be measured, as the phase between the clocks has shifted 180 degrees (twelve blocks of thirteen clock cycles). To determine a specific phase, sampling is carried out every 13 clock cycles until a transition from 0 to 1 is observed. At this point, the phase between the signals is closest to 0 degrees.

Due to metastability (or just phase noise between the clocks), this transition can have an error on the sample closest to the transition. Metastability is unlikely to propagate, because the next measurement occurs thirteen clock cycles later, at which point it should have settled down. So this technique to measure the phase has a potential error of 15 degrees—this is approximately 1.6 ns phase measurement error. If the samples are taken once every eleven clock cycles, the phase would shift also by 15 degrees each time, but in the opposite direction.

Using this information, the following algorithm can be used to resolve the phase:

Loop:
If [Input GPIO] is 'Low', then repeat loop after 13 clock cycles.
If [Input GPIO] is 'High':
If the last loop measured a low' then Exit—the phase is currently between 0 and 15 degrees.
Else If [the last loop measured a 'High'] repeat loop after 11 clock cycles.

At the end of this loop, the phase will be between 0 and 15 degrees, plus or minus 15 degrees if the phase noise has led to a metastable event. At this point, the current time in clock cycles is read, as well as the time of last clock, and the difference between the two values recorded.

This scheme can also be used to set a specific required phase between the internal clock and the external oscillator signal by disciplining the external oscillator to achieve the required phase. If a specific phase is required other than 0 degrees, it can be set by adding 13 to this difference for each 15 degrees of phase advance wanted.

An example of how such a scheme could be used in conjunction with temperature compensation is as follows. A GNSS receiver may be designed to discipline its oscillator with reference to the GNSS signals as previously discussed. During holdover of the GNSS signal, the receiver may use a temperature compensation scheme to maintain its frequency as previously discussed. In addition, it may sample the signal from an external oscillator on a GPIO pin using the internal oscillator signal or a clock at a different frequency derived from the internal oscillator using a synthesizer. In the latter case, the stability of the sampling clock will equal that of the internal oscillator signal to which it is phase-locked by the synthesizer. Now, by the means discussed above, the frequency of the external oscillator can be estimated with reference to the sampling clock which is precisely related to that of the internal oscillator frequency which is disciplined with respect to the GNSS signals.

In another embodiment the frequency of a signal (external clock) derived from the external oscillator signal using a synthesizer may be measured in this way.

The internal oscillator need not be disciplined of course. Its offset from nominal can simply be tracked with reference to the GNSS signals and the frequency of the external oscillator can still be estimated with reference to the GNSS signals by taking account of the offset in the internal oscillator frequency.

In a further enhancement, the external oscillator can be disciplined to achieve the required frequency.

In an alternative enhancement, the external oscillator can be disciplined to achieve a required phase shift of the external clock with respect to the sampling clock. This can be useful if the sampling clock is also used to generate a timing pulse which is to be latched by an external circuit clocked by the external clock. By maintaining the required phase offset, the frequency of the external oscillator is also kept extremely stable.

It will be appreciated by the person skilled in the art that various modifications may be made to the above described embodiments without departing from the scope of the present invention.

The invention claimed is:

1. A method of compensating for temperature related frequency drift of an oscillator, the method comprising:
using an external reference frequency signal to derive oscillator compensation data over a range of operating temperatures;
storing the oscillator compensation data in a first table;
for a given operating temperature, using the first table to obtain corresponding oscillator compensation data and applying the obtained data to provide compensation for the temperature related frequency drift; and
defining, for the range of operating temperatures, a series of temperature slots each sub-divided into a series of temperature bins;
wherein using an external reference frequency signal to derive oscillator compensation data over the range of operating temperatures comprises:
a) measuring an operating temperature and using the external reference frequency signal to determine oscillator compensation values for respective temperatures as the operating temperature varies;
b) accumulating the determined oscillator compensation values in corresponding temperature bins of a second table by adding the determined values to sums in the bins and incrementing counts for the bins;

c) at spaced intervals in time, using the accumulated values to determine or update the oscillator compensation data stored for one or more slots in the first table.

2. The method according to claim 1, wherein said step of applying the oscillator compensation data to provide compensation for the temperature related frequency drift comprises applying the oscillator compensation data to the oscillator in dependence upon a current temperature in order to discipline the oscillator and thereby obtain a temperature compensated oscillator frequency.

3. A method of operating a Global Navigation Satellite System, GNSS, receiver having an oscillator and a receiver for receiving at least one GNSS radio signal providing an external reference frequency signal, the method comprising using the method of claim 2 in order to discipline the oscillator.

4. The method according to claim 1, wherein said step of applying the oscillator compensation data to provide compensation for the temperature related frequency drift comprises applying the oscillator compensation data to a processing operation that uses as an input a frequency output by the oscillator, where the oscillator operates as a non-disciplined oscillator.

5. The method according to claim 1 and comprising retaining, in the second table, only data associated with:
    temperature bins within a current temperature slot, where the current temperature slot contains the current temperature; and temperature bins associated with one or more temperature slots which are sequential with said current temperature slot,
    the total number of temperature slots for which data are retained being less than the total number of temperature slots.

6. The method according to claim 5, wherein the or each sequential slot is a slot adjacent to the current temperature slot.

7. The method according to claim 1, comprising maintaining a third table, wherein step c) comprises, at said spaced intervals in time, using the accumulated values in the temperature bins of the second table to determine or update data stored for the corresponding slots in the third table and using the data in the third table to populate the first table.

8. The method according to claim 7, wherein said step of using the accumulated values in the temperature bins of the second table to determine or update data stored for the corresponding slots in the third table comprises, for each slot, determining or updating parameters of a linear fit to the data in the bins of the slot and storing the parameters in the third table.

9. The method according to claim 8, wherein said parameters are an oscillator compensation value for a given temperature of the slot and a rate of change value.

10. The method according to claim 8, wherein the step of updating said parameters comprises combining, for each slot, the currently stored parameters with respective newly determined parameters.

11. The method according to claim 10, comprising storing in the third table, for each slot, a variance value of each parameter, said step of combining taking account of the associated variance value.

12. The method according to claim 8, wherein said step of using the data in the third table to populate the first table comprises adjusting the parameters of each slot in order to align the linear fits at slot boundaries.

13. The method according to claim 8, wherein said step of using the first table to obtain corresponding oscillator compensation data comprises interpolating the data in the first table to obtain an oscillator compensation value for the current operating temperature.

14. The method according to claim 1, wherein step c) is carried out for a given temperature slot if it is determined that the total number of accumulated values for that slot exceeds a predefined threshold and that values are accumulated for at least a predefined fraction of the total number of bins in the slot.

15. The method according to claim 14, wherein, if both of the conditions are not met for a given slot, the largest of the bin sums is identified and a determination made as to whether or not the largest sum exceeds a predefined threshold and, if yes, then all of the bin sums and count values for the slot are scaled back by a factor greater than 1 and, if no, then the bin sums and count values for the slot are left unchanged.

16. The method according to claim 1, wherein, at a), the step of using the external reference frequency signal to determine oscillator compensation values comprises one of:
    mixing the external reference frequency signal with an output of, or derived from, the oscillator to determine a frequency difference;
    counting cycles of the reference frequency signal during a period of a signal harmonically related to an output of, or derived from, the oscillator; or
    measuring a phase difference between the external reference frequency signal and an output of, or derived from, the oscillator at spaced intervals in time.

17. Apparatus comprising:
an oscillator;
a receiver configured to receive an external reference frequency signal;
a physical memory;
a temperature sensor; and
a processing circuit configured:
    to use the external reference frequency signal to derive oscillator compensation data over a range of operating temperatures,
    to store the oscillator compensation data in a first table within the physical memory and, for a given operating temperature, and
    to use the first table to obtain corresponding oscillator compensation data and apply the obtained data to provide compensation for the temperature related frequency drift,
wherein the processing circuit defines, for the range of operating temperatures, a series of temperature slots each sub-divided into a series of temperature bins, and in that the processor is configured to use an external reference frequency signal to derive oscillator compensation data over the range of operating temperatures by
a) measuring an operating temperature and using the external reference frequency signal to determine oscillator compensation values for respective temperatures as the operating temperature varies;
b) accumulating the determined oscillator compensation values in corresponding temperature bins of a second table within the physical memory by adding the determined values to sums in the bins and incrementing counts for the bins; and
c) at spaced intervals in time, using the accumulated values to determine or update the oscillator compensation data stored for one or more slots in the first table.

18. A Global Navigation Satellite System receiver comprising the apparatus of claim 17.

* * * * *

UNITED STATES PATENT AND TRADEMARK OFFICE
CERTIFICATE OF CORRECTION

PATENT NO. : 10,651,854 B2
APPLICATION NO. : 15/473112
DATED : May 12, 2020
INVENTOR(S) : Roderick Bryant and Eamonn Glennon Page 1 of 1

It is certified that error appears in the above-identified patent and that said Letters Patent is hereby corrected as shown below:

On the Title Page

Item (30), under "Foreign Application Priority Data," "16163419" should read --16163419.1--.

Signed and Sealed this
Sixteenth Day of June, 2020

Andrei Iancu
*Director of the United States Patent and Trademark Office*